United States Patent
Basker et al.

(10) Patent No.: US 9,379,025 B1
(45) Date of Patent: Jun. 28, 2016

(54) METHOD OF FORMING SOURCE/DRAIN CONTACTS IN UNMERGED FINFETS

(71) Applicant: International Business Machines Corporation, Armonk, NY (US)

(72) Inventors: Veeraraghavan Basker, Schenectady, NY (US); Kangguo Cheng, Schenectady, NY (US); Ali Khakifirooz, Los Altos, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/744,080

(22) Filed: Jun. 19, 2015

(51) Int. Cl.
| | |
|---|---|
| H01L 29/78 | (2006.01) |
| H01L 21/8238 | (2006.01) |
| H01L 21/8234 | (2006.01) |
| H01L 21/02 | (2006.01) |
| H01L 21/311 | (2006.01) |
| H01L 21/283 | (2006.01) |
| H01L 27/092 | (2006.01) |

(52) U.S. Cl.
CPC .. *H01L 21/823821* (2013.01); *H01L 21/02304* (2013.01); *H01L 21/283* (2013.01); *H01L 21/31144* (2013.01); *H01L 21/823418* (2013.01); *H01L 27/0924* (2013.01)

(58) Field of Classification Search
CPC ............... H01L 21/823821; H01L 29/41791; H01L 29/7853; H01L 29/7858
See application file for complete search history.

(56) References Cited

U.S. PATENT DOCUMENTS

| 6,372,647 B1 | 4/2002 | Lu |
| 8,263,451 B2 | 9/2012 | Su |
| 2011/0042744 A1* | 2/2011 | Cheng ............... H01L 29/66795 257/347 |
| 2011/0298058 A1 | 12/2011 | Kawasaki |
| 2013/0181264 A1* | 7/2013 | Liao ....................... H01L 29/785 257/288 |
| 2015/0091100 A1* | 4/2015 | Xie .................... H01L 21/76224 257/401 |
| 2015/0137181 A1* | 5/2015 | Basker ................ H01L 27/0924 257/192 |

FOREIGN PATENT DOCUMENTS

WO 2011/023518 3/2011

\* cited by examiner

*Primary Examiner* — Thomas L Dickey
(74) *Attorney, Agent, or Firm* — Law Office of Charles W. Peterson, Jr.; H. Daniel Schnurmann; Steven J. Meyers

(57) ABSTRACT

A method of forming field effect transistors (FETs), and forming integrated circuit (IC) chip including the FETs. After forming replacement metal gate (RMG) FinFETs on a surface layer of a silicon on insulator (SOI) wafer, and growing unmerged epitaxially (epi) on the fins, the epi is capped with dielectric and an inter-level dielectric (ILD) layer is formed on the SOI wafer. The said ILD layer is patterned to an upper surface of the epi above encased fins in a timed etch. Then, etching, preferably with an etchant selective to silicon, the epi is opened to, and into, the fins. The resulting orifices are filled with conductive material to form source drain contacts.

20 Claims, 11 Drawing Sheets

US 9,379,025 B1

METHOD OF FORMING SOURCE/DRAIN CONTACTS IN UNMERGED FINFETS

BACKGROUND OF THE INVENTION

1. Field of the Invention

The present invention is related to semiconductor devices and manufacturing, and more particularly, to forming fin field effect transistors (FinFETs) on semiconductor wafers and methods of manufacturing Integrated Circuits (ICs) with circuits including multi-fin FinFETs.

2. Background Description

Integrated Circuit (IC) chip density and performance are primary semiconductor technology development goals. Semiconductor technology and chip manufacturing advances have improved performance through a steady increase of on-chip clock frequencies, coupled with a corresponding decrease in chip supply voltage resulting in part from reduced chip feature size.

To minimize power consumption, typical ICs are made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. For example, a CMOS inverter is a series connected PFET and NFET pair that are connected between a power supply voltage ($V_{dd}$) and ground (GND). The pair of devices have operating characteristics that are, essentially, opposite each other. So, when one device (e.g., the NFET) is on (ideally modeled as a closed switch) and conducting current ($I_{on}$) driving a load capacitance ($C_{load}$) up or down; at the same time the other device (the PFET) is off, not conducting (ideally modeled as an open switch) and, vice versa.

Increased chip density (the average density of circuit transistors on a chip), and chip die size has increased the number of transistors packed on a single chip; while features sizes have been shrunk to pack more transistors in the same area. Another state of the art approach to increasing FET density is forming FETs vertically on narrow semiconductor surface ridges or fins. Minimum feature sized lines of semiconductor material are formed on the surface of a bulk semiconductor wafer or from the surface layer of a silicon on insulator (SOI) wafer. The semiconductor lines or ridges form fins on the surface with gates formed on the fins for tightly packed vertical FETs. These vertical FETs are known as FinFETs. $I_{on}$ is directly related to the ratio of the device width to its length. Since FinFET width is limited in large part by fin height, designers form FinFET gates on multiple parallel connected fins to increase $I_{on}$ in FinFET. The narrow parallel fins form non-planar source and drain regions make it challenging to contact FinFET source/drains.

One state of the art approach to contacting multi-fin FET source/drains, typically referred to as merged fin, involves epitaxially growing a highly doped semiconductor layer that merges the fins at source/drain regions. This epitaxial layer provides a uniform, planar surface for forming source/drain contacts. Another state of the art approach, typically referred to as unmerged fin, involves epitaxially growing highly doped semiconductor, e.g., diamond shaped epi, on pitched fins without the epi merging. Instead, the epi forms individual, source/drain regions at each fin.

Etching these unmerged source/drain regions, e.g., using a typical reactive ion etch (RIE), re-exposes the fins for silicide. Unfortunately, the RIE is non-selective and etches off the highly conductive epi at source/drain regions, reducing the area available for contacts. Consequently, the loss of available contact area results in higher resistance ($R_s$) in subsequently formed contacts. $R_s$ is a series resistance that adds to device on impedance, and as such, reduces drive current, which reduces circuit performance. Previous approaches to minimizing the reduction in contact area have added fabrication steps, e.g., covering gates with nitride, that increased fabrication complexity and resulting fabrication costs.

Thus, there is a need for reducing FinFET contact resistance, and more particularly, a need for unmerged FinFETs with low, unmerged-fin contact resistance.

SUMMARY OF THE INVENTION

In an aspect of embodiments of the invention FinFET Integrated Circuit (IC) chip performance is improved;

In another aspect of embodiments of the invention contact resistance is reduced in FinFETs;

In yet another aspect of embodiments of the invention FinFET contact resistance is minimized for improved Integrated Circuit (IC) chip performance.

Embodiments of the invention relate to a method of forming field effect transistors (FETs), and forming integrated circuit (IC) chip including the FETs. After forming replacement metal gate (RMG) FinFETs on a surface layer of a silicon on insulator (SOI) wafer, and growing unmerged epitaxially (epi) on the fins. Instead of removing epi to re-expose the fins, epi is capped with dielectric and an inter-level dielectric (ILD) layer is formed on the SOI wafer. The said ILD layer is patterned to an upper surface of the epi above encased fins in a timed etch. Then, etching, preferably with an etchant selective to silicon, the epi is opened forming orifices to, and into, the fins. The resulting orifices are filled with conductive material to form source drain contacts.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
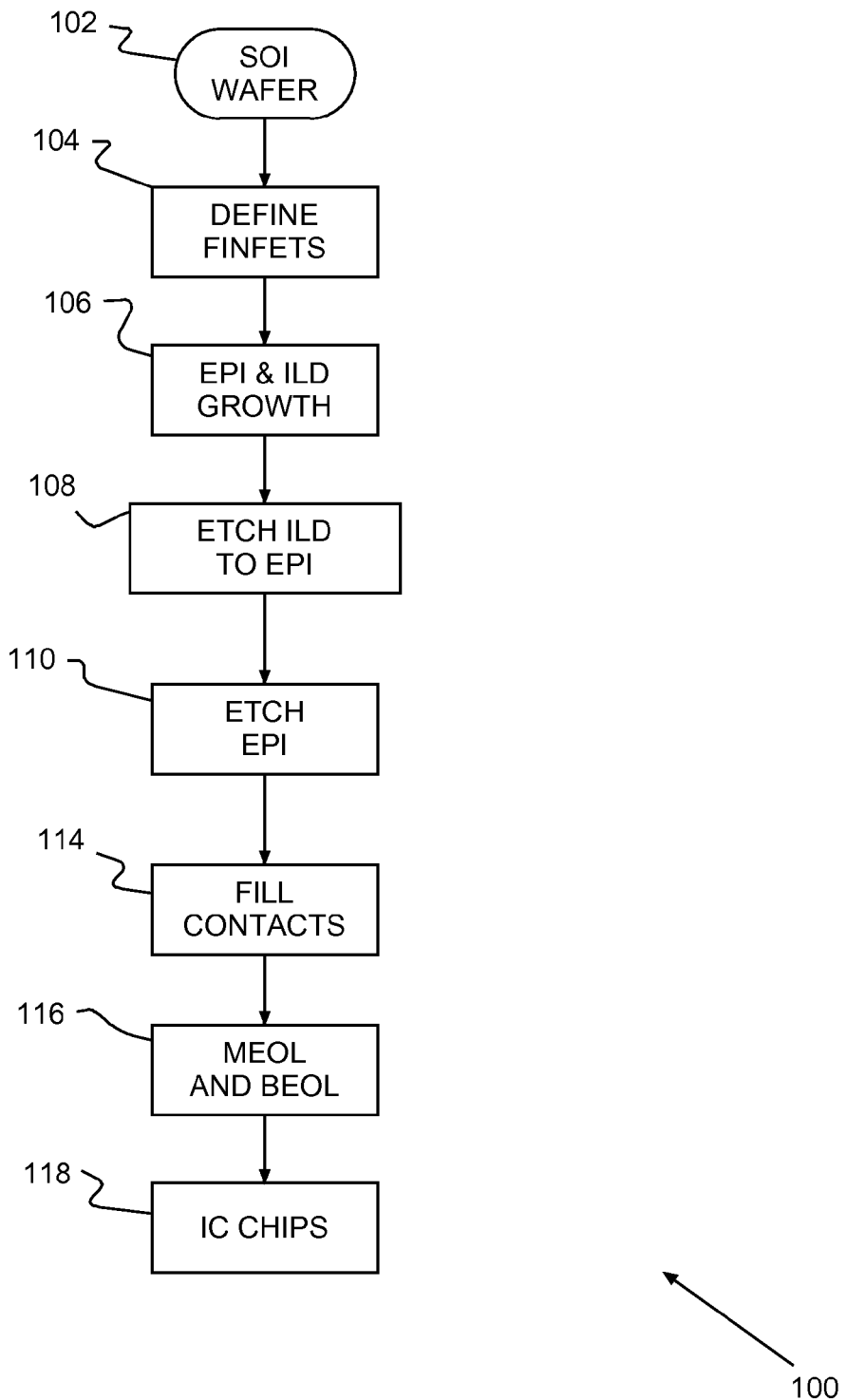
FIG. 1 shows an example of a preferred method for forming field effect transistors (FETs) and, more particularly forming contacts to unmerged epi FinFETs.

Turning now to the drawings and, more particularly, FIG. 1 shows an example of a preferred method of forming field effect transistors (FETs), e.g., in an integrated circuit (IC), and more particularly, forming unmerged epitaxially-grown semiconductor (epi) FinFETs according to a preferred embodiment of the present invention. Preferred unmerged FinFETs are covered by a contact dielectric or inter-level dielectric (ILD) layer. A timed etch of the ILD exposes the tops of the unmerged epi for contact formation. Etching through the epi into buried fins leaves the highly doped source/drain epi intact and increases contact area, reducing contact resistance over contacts formed using prior contact formation methods.

Fabrication begins in step 102 with providing a typical semiconductor wafer, e.g., a bulk semiconductor wafer, or as shown in this example, a silicon on insulator (SOI) wafer. In step 104 chip devices (FETs) are defined, e.g., by defining and forming fins in a surface layer of the SOI wafer, forming a gate dielectric layer on the surface, a gate layer on the gate dielectric layer and defining gates on the fins. Source/drain conduction regions may be formed, e.g., implanting suitable dopant, and highly doped epi is grown on the doped fins. In step 106 the epi is grown on fins at source/drain regions, and an ILD or contact layer is formed above the devices.

In step 108 a timed etch, selective to dielectric, opens a contact pattern through the contact dielectric layer to re-expose the tops of the epi. In step 110 a second etch, selective to silicon, etches away just the exposed epi and into the epi, primarily into the submerged fins for increased contact area. In step 112 a contact liner layer is formed on the etched surface and filled with conductive material to complete the contacts. In step 114 chip and device processing continues through normal back end of the line (BEOL) steps to complete Integrated circuit (IC) chip definition 116.

Figure 2:
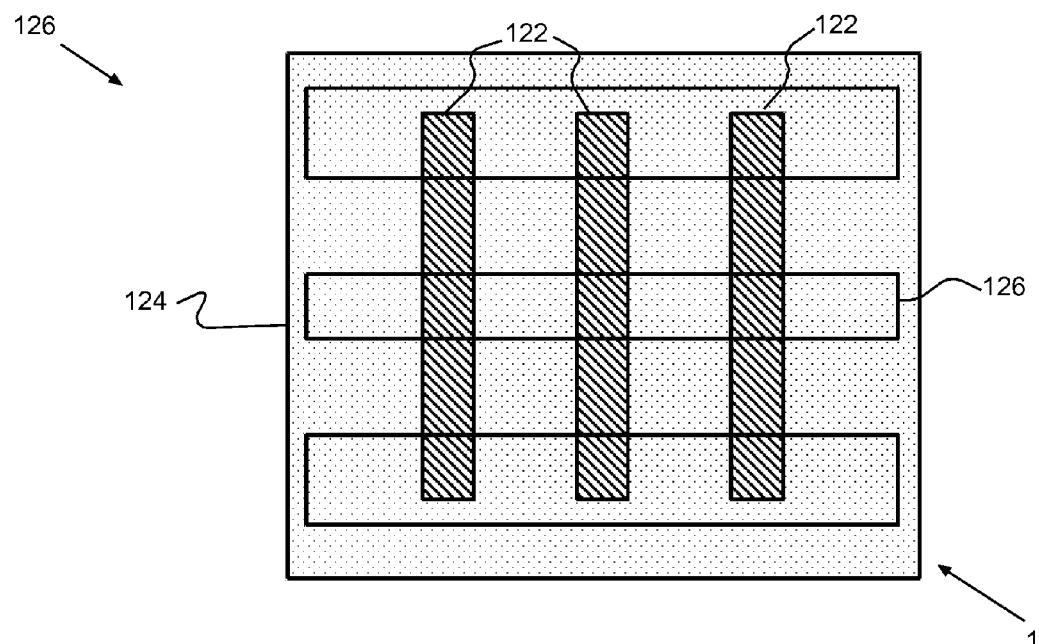
FIG. 2 shows a plan view example of a defined FinFET.

FIG. 2 shows a plan view example of a FinFET 120 defined in step 104 of FIG. 1. The FinFET 120 includes multiple fins 122 formed in the surface of the wafer 124 provided in step 102, the surface layer of an SOI wafer in this example. Gates 126 formed on the fins 122 define FinFETs 120. Preferred FinFETs 120 may be replacement metal gate (RMG) devices, where the gates formed in step 104 are sacrificial gates, preferably polysilicon, that is subsequently replaced with metal, or what are known in the art as gate-first devices.

Figure 3A:
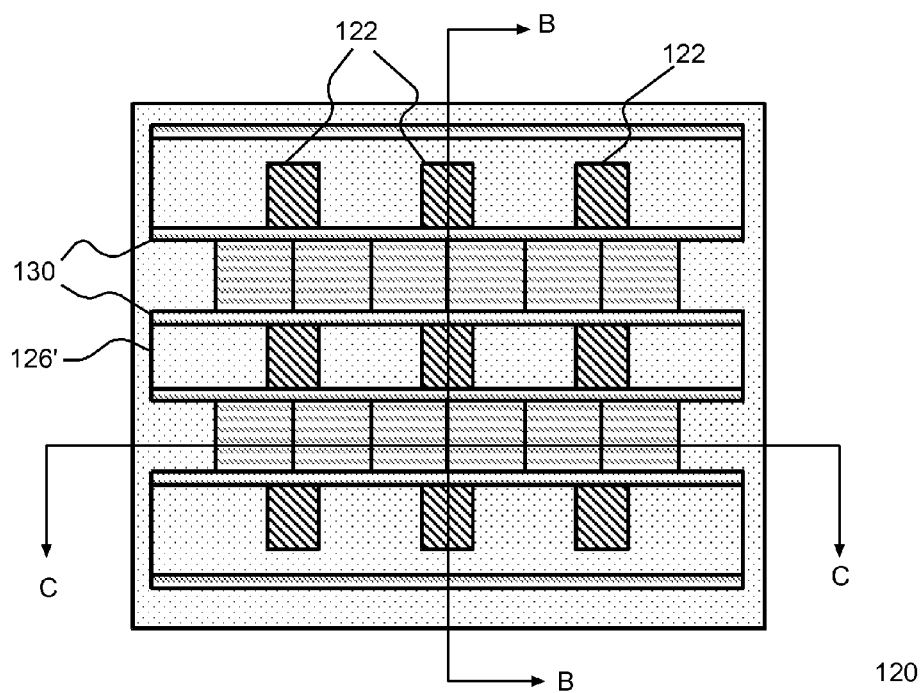
FIGS. 3A-3C show an example of the defined FinFET after replacing the sacrificial polysilicon with metal, and after forming the epi and ILD.
Figure 3B:
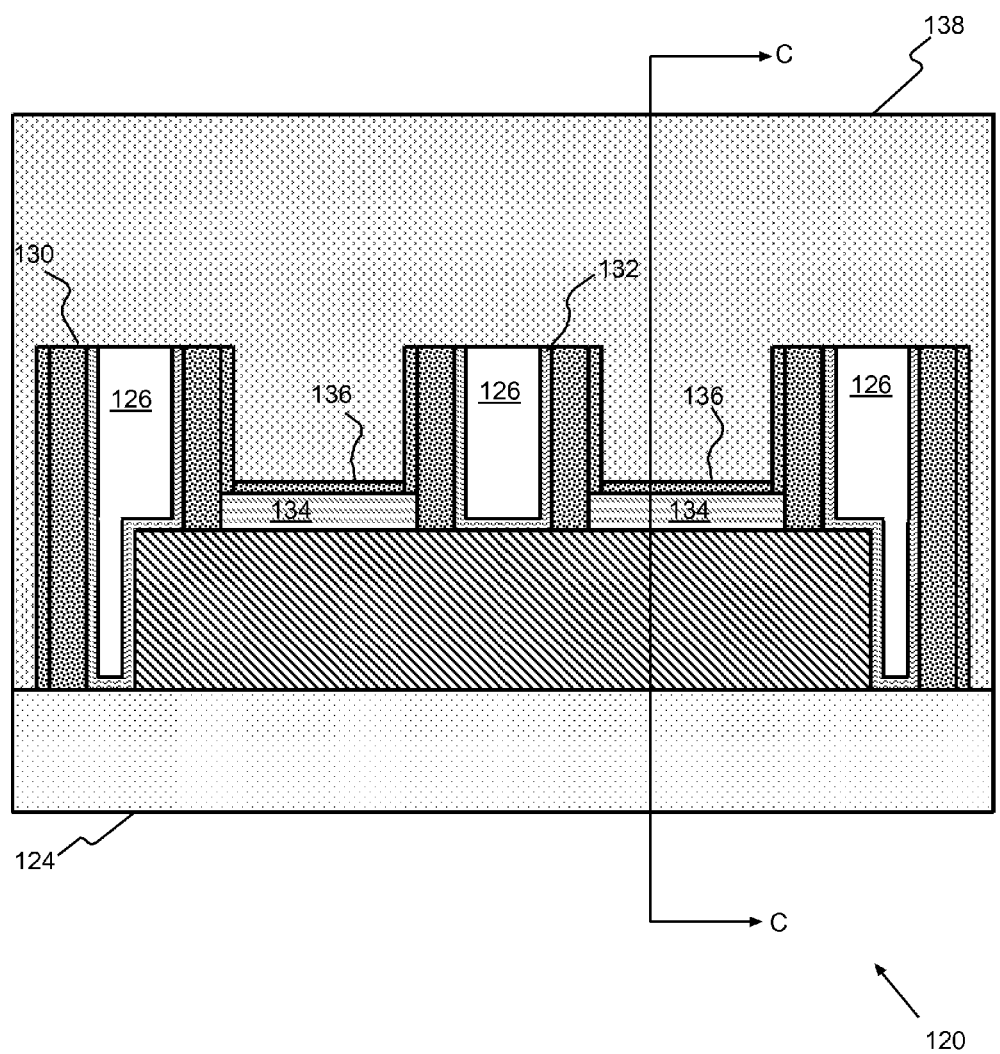
Figure 3C:
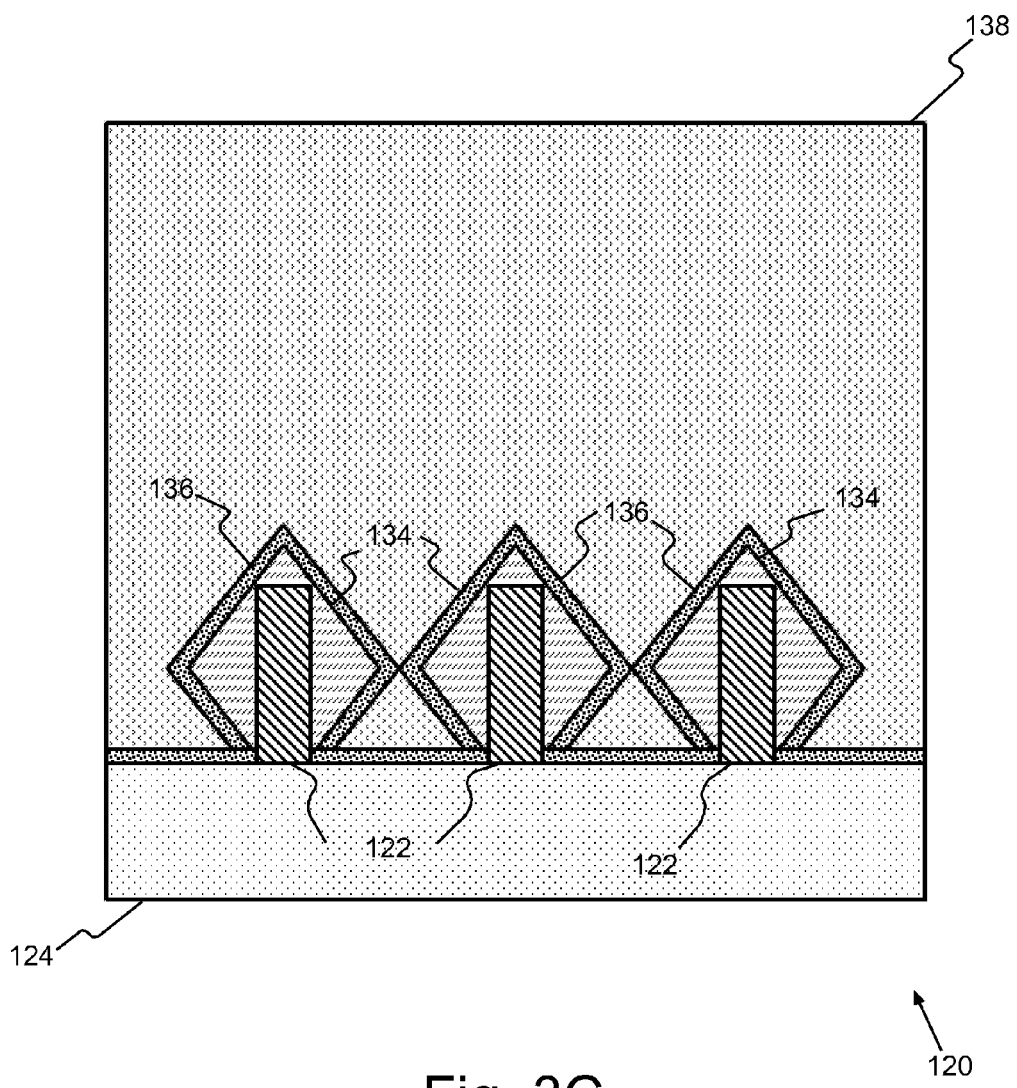

FIG. 3A shows a plan view example of the FinFET 120 after forming the epi and ILD (step 106 of FIG. 1) on using well known formation steps, with a cross section through B-B in FIG. 3B and through C-C in FIG. 3C. Although shown in this example, wherein epi forms diamond shaped, it should be noted that this is for example only and not intended as a limitation. Epitaxially-grown semiconductor may be grown in any desired shape without departing from the present invention. replacing the sacrificial polysilicon with metal, Sidewall spacers 130, preferably nitride, SiBCN, or SiOCN, formed along the sacrificial gates define source/drain extensions during FET source/drain definition. If the FinFETs 120 are RMG devices, after defining the sidewall spacers 130, sacrificial gate dielectric is replaced with a high-k dielectric 132, and the sacrificial gates are replaced with a suitable metal, preferably copper. A doped semiconductor is grown epitaxially on source/drain fin regions to form epi 134 encasing fins 122. Again in this example, the epi 134 forms diamond shaped with a diamond vertex above an encased fin 122. Preferably, the doped semiconductor is phosphorous or arsenic-doped silicon (Si) grown on NFET fins, and boron-doped silicon germanium (SiGe) grown on PFET fins. A dielectric layer 136, preferably nitride, caps the epi 134, and in this example, extends along the sidewall spacers 130. The nitride capping layer 136 prevents epi oxidation during ILD 138 formation. The ILD layer 138, preferably oxide, covers the wafer 124 above the gates 126.

Figure 4A:
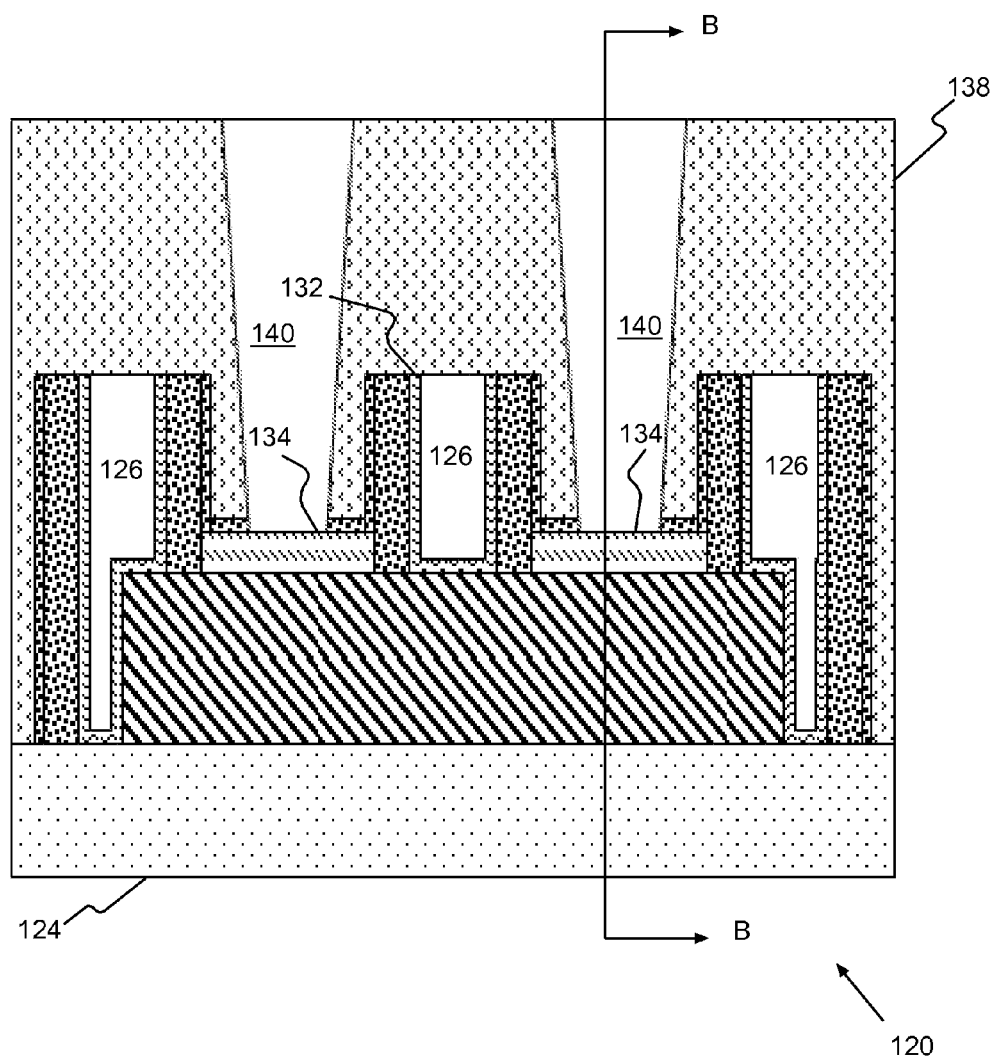
FIGS. 4A-4B show an example of a contact opening formed through the ILD layer.
Figure 4B:
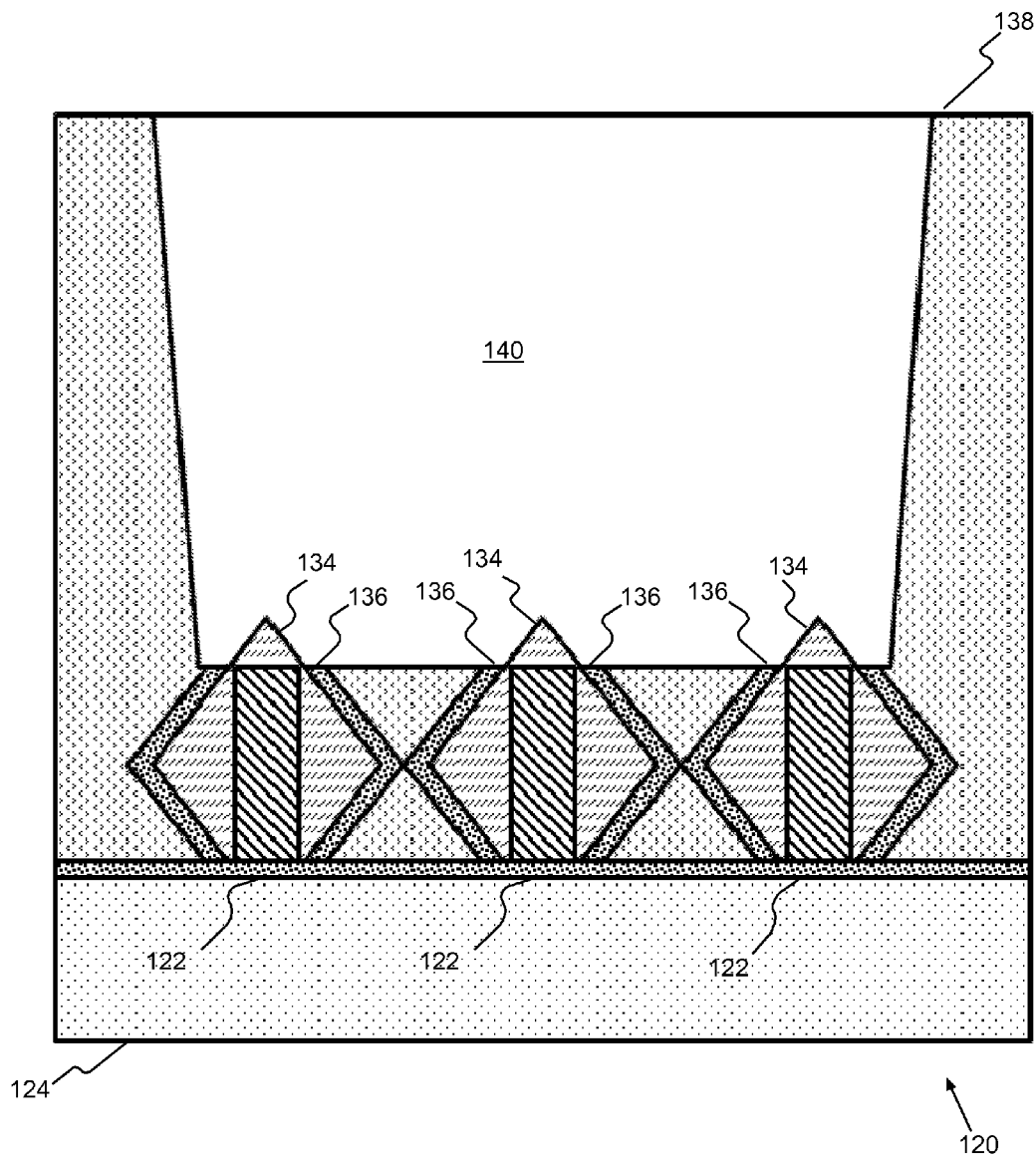

FIG. 4A shows a cross sectional example of a contact opening 140 formed through the ILD layer (138 in FIGS. 3A-C) and the capping layer 136 in step 108 of FIG. 1, with a cross section through B-B in FIG. 4B. Preferably a photolithographic mask (not shown) defines the contact pattern. After forming the mask a timed reactive ion etch (RIE) opens contact openings 140 in the ILD 138 down to, and through, the nitride capping layer 136, exposing the tops of epi 134. Optionally, the epi 134 may be silicided, e.g., prior to capping layer 136 formation to wrap around the epi 134. Although not shown in this example, depending on the selected etchant, part of the epi 134 tops may be also removed with the ILD 138 and capping layer 136.

Figure 5A:
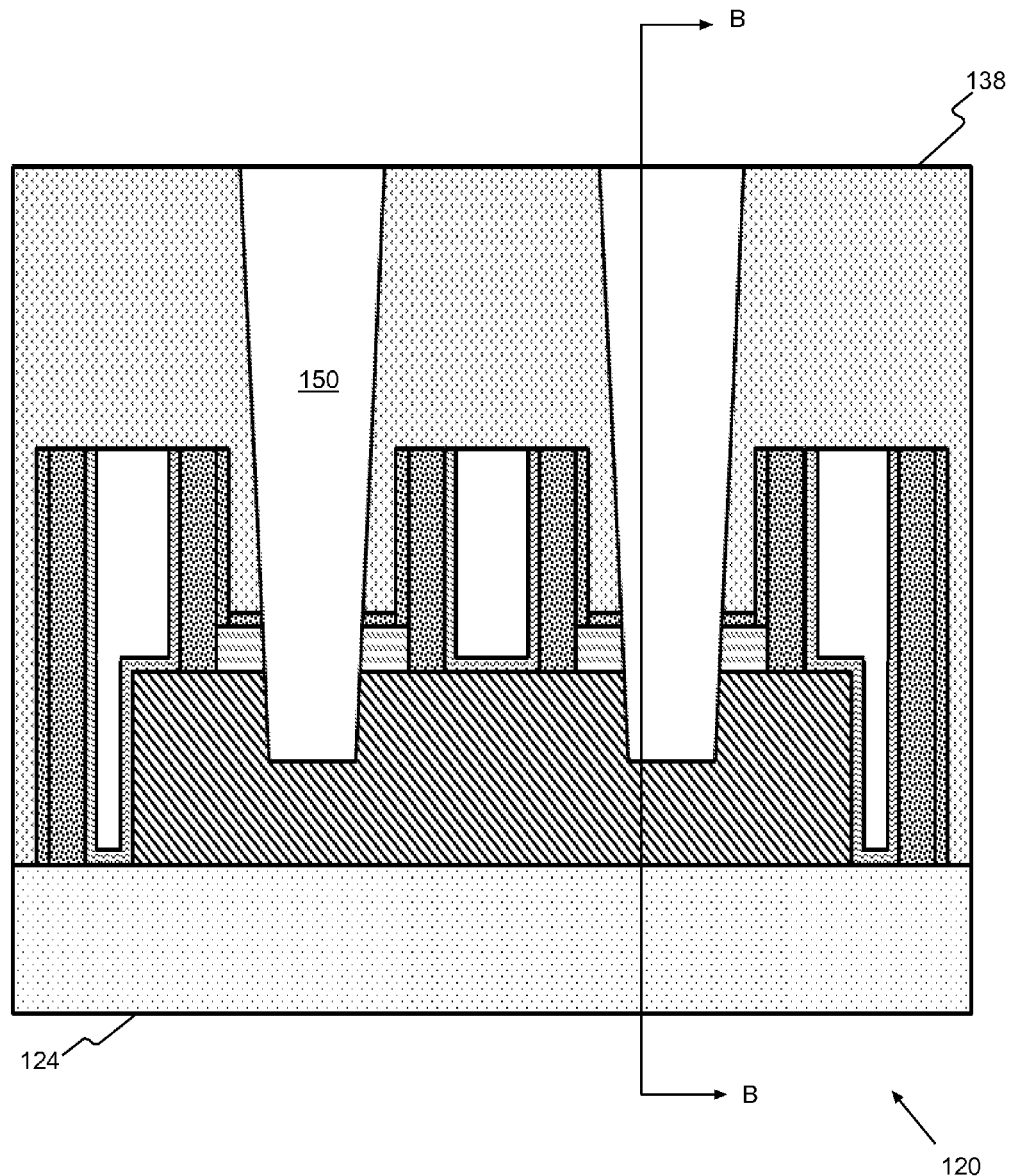
FIGS. 5A-5B show an example of the contact opening extending into the epi.
Figure 5B:
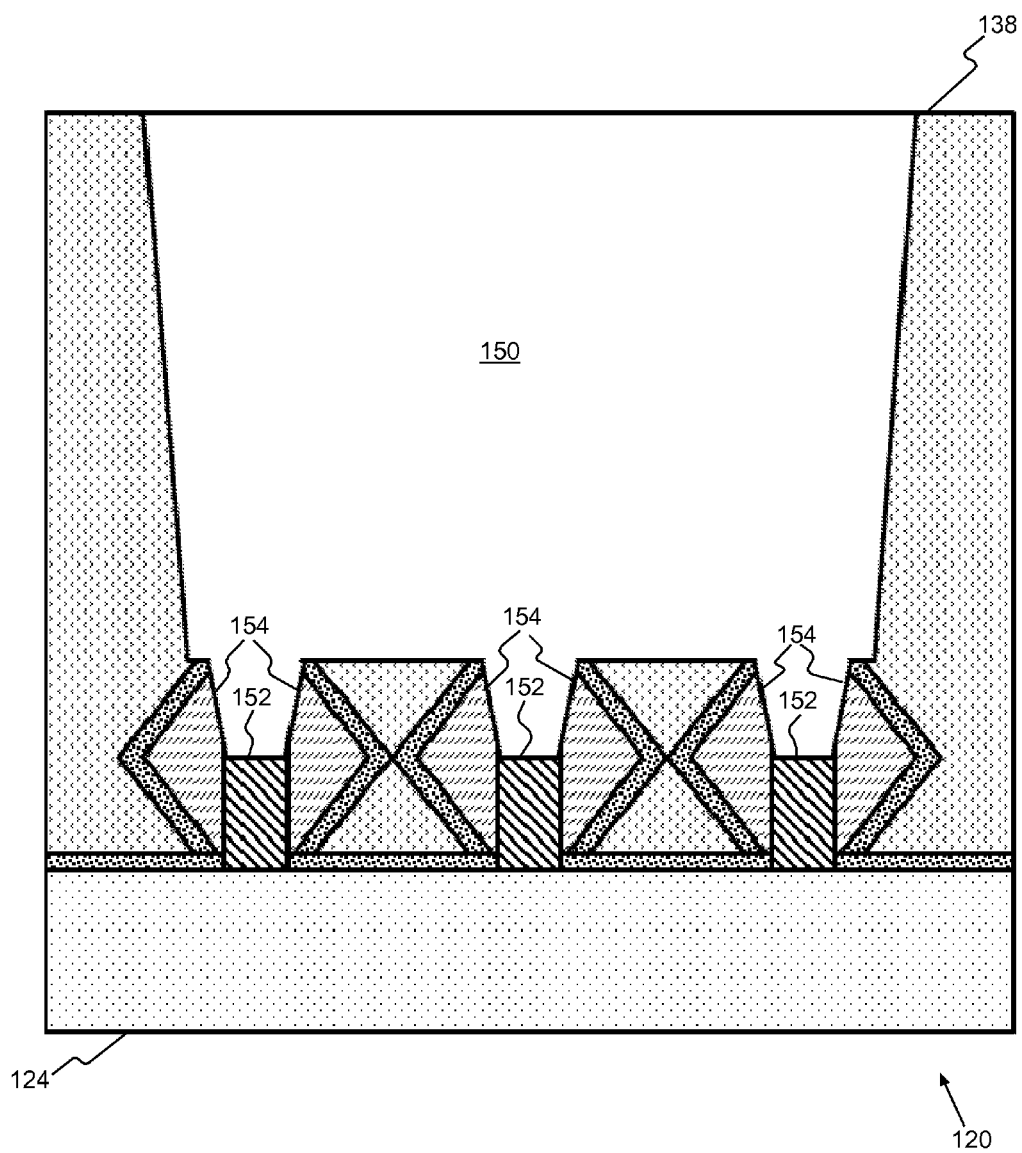

FIG. 5A shows a cross sectional example of a completed contact orifice 150 extending into the epi 134 (in step 110 of FIG. 1), with a cross section through B-B in FIG. 5B. Preferably, a suitable etch selective to silicon etches away the exposed top of, and into the, epi 134 primarily into the submerged fins 122. Optionally, since the etch is selective to silicon, the contact mask may be removed prior to etching the epi 134 to open orifices 150. Forming orifices 150 exposes the tops 152 of submerged fins 122 and the internal epi sidewalls 154.

Figure 6A:
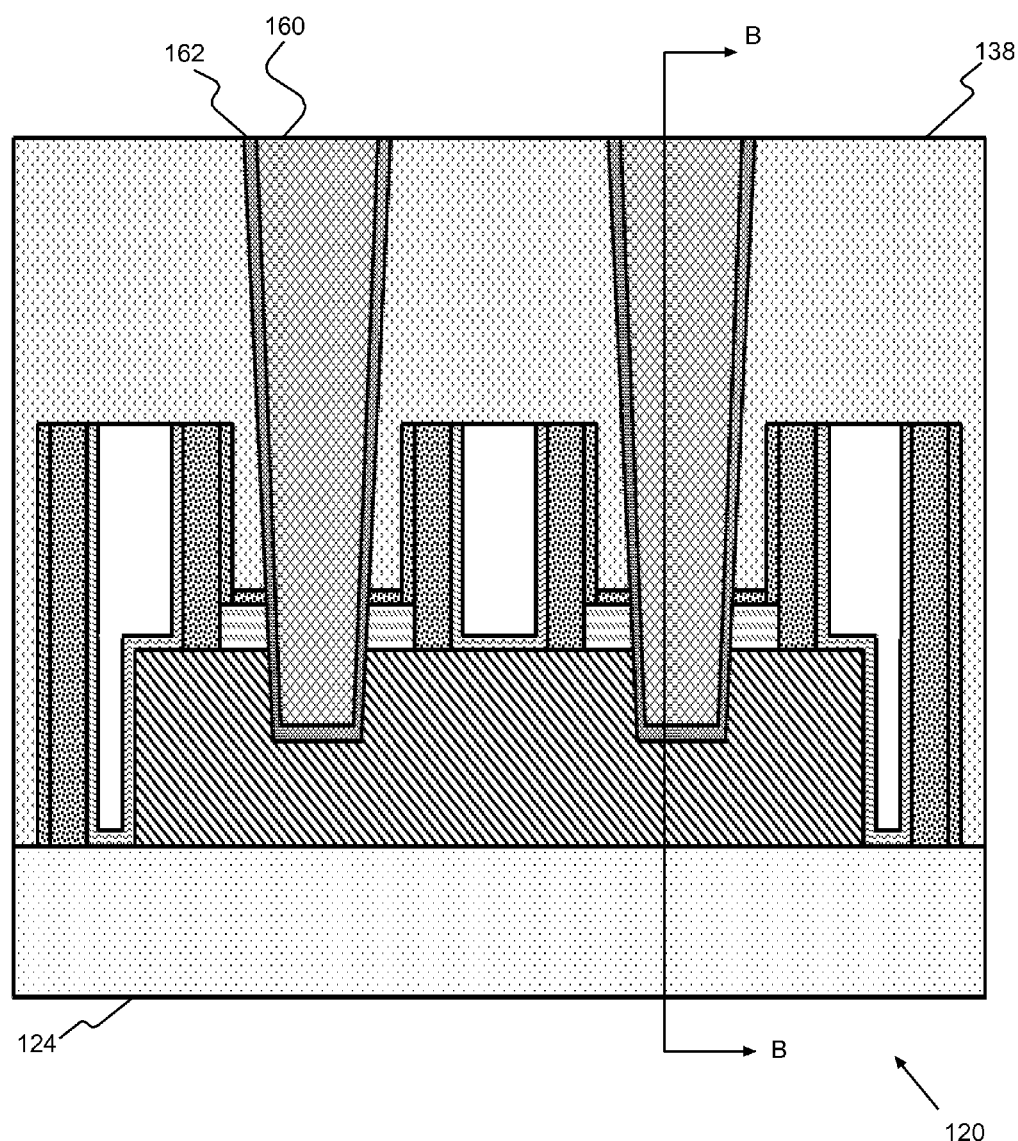
FIGS. 6A-6B show an example of completed source/drain contacts.
Figure 6B:
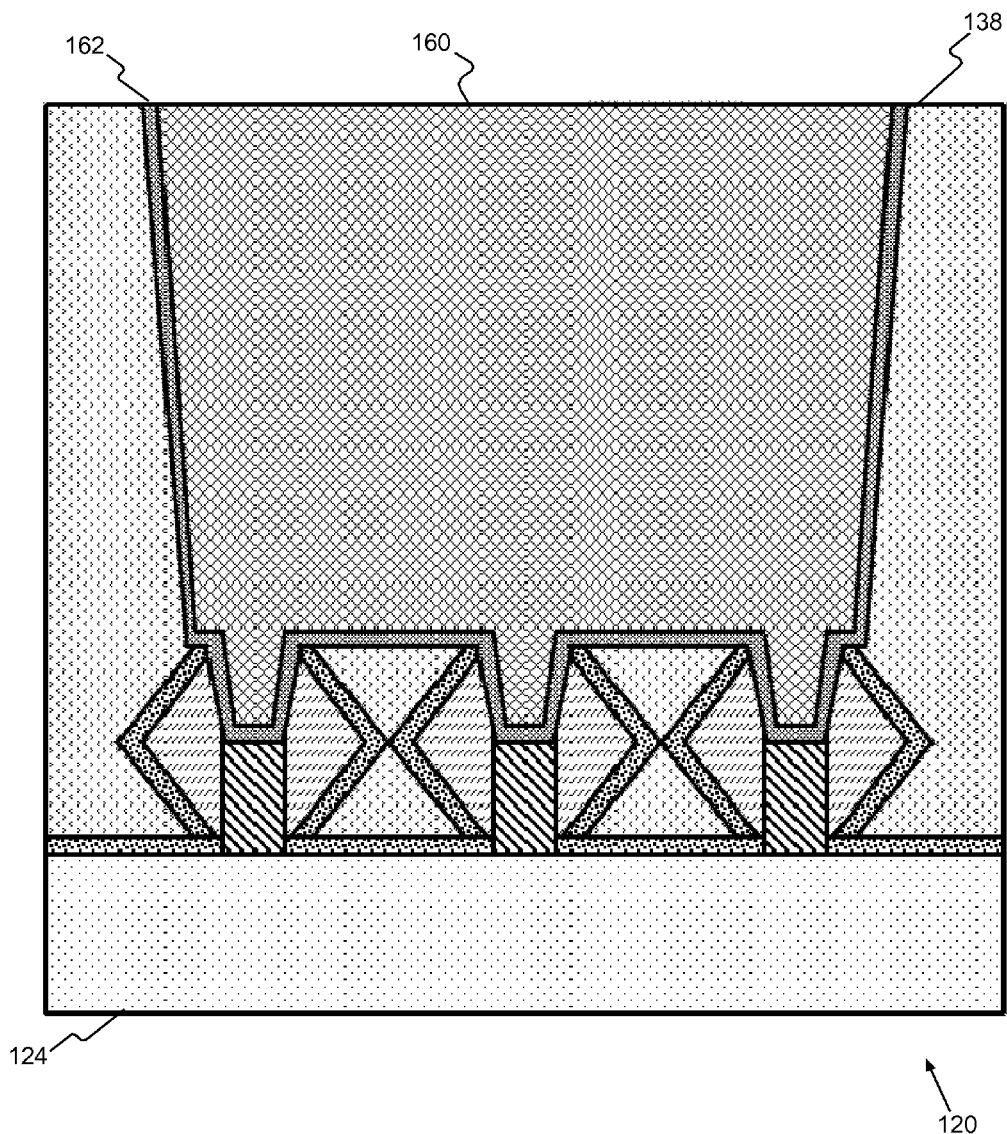

FIG. 6A shows a cross sectional example of source/drain contacts 160 formed in step 112 of FIG. 1, with a cross section through B-B in FIG. 6B. In this embodiment a contact liner layer 162 is formed on the wafer 124 coating the contact pattern orifices 150 in FIGS. 5A and 5B. The liner 162 may be, for example, nickel, cobalt, platinum, titanium, or tantalum. Alternately, the orifice sidewalls 154 and bottoms (tops 152 of submerged fins 122) are silicided in a well-known self-aligned silicide (silicide) formation. A metal layer, e.g., tungsten or copper, formed on the contact liner layer 162 fills the contact pattern orifices 150. Then, horizontal portions of the metal layer and the contact liner layer 162 may be removed, for example, with a suitable chemical mechanical polish (CMP) to the ILD 138. The CMP leaves the contact pattern filled with contacts 160.

Figure 7:
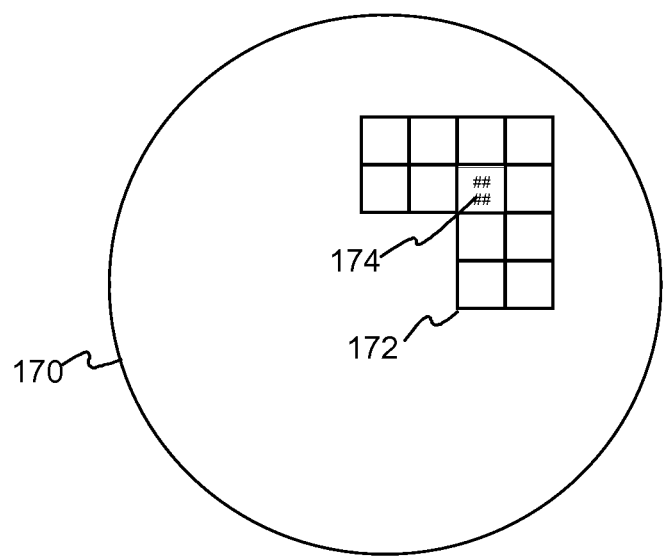
FIG. 7 shows an example of a wafer with completed IC chips after normal BEOL and chip definition with devices wired together and into circuits that are connected to pads and off chip.

FIG. 7 shows an example of a wafer 170 with completed IC chips 172 after normal BEOL and chip definition (114 and 116 in FIG. 1). After forming source/drain contacts, wiring layers are formed using a suitable metal formation process, e.g., in a dual damascene metal line formation step, to connect 114 FinFETs into circuits. The metal lines on upper layers (not shown) wire chip FETs into chip circuits 174 and chip circuits 174 together. One or more of the connected circuits 174 includes at least one preferred FinFET.

Advantageously, preferred unmerged FinFETs have source/drain contacts with greater surface area than prior unmerged FinFETs, for lower source/drain contact resistance. Thus, reduced contact resistance provides higher overall (faster) chip performance at lower power consumption.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. An unmerged fin field effect transistor (FinFET) comprising:
a plurality of fins on the surface of a semiconductor wafer;
one or more gates on said fins;

doped conduction regions, at least one of said one or more gates covering a channel between conduction regions on one or more fins;

epitaxially grown doped semiconductor material (epi) on and encasing each said fins at a respective said conduction region;

an epi capping layer on and covering said epi, said epi capping layer separating adjacent epi encased fins from each other;

an inter-level dielectric (ILD) layer on said wafer covering said epi capping layer; and a conduction region contact at each said conduction region, each said conduction region contact through said ILD layer and said epi capping layer and into each said epi encased fin, said each conduction region contact contacting internal epi sidewalls and the respective encased fins.

2. A CMOS integrated circuit (IC) chip including a plurality of unmerged FinFETs as in claim 1 connected together in one or more circuits, wherein said semiconductor wafer is a silicon on insulator (SOI), said surface is silicon surface layer, said gates are metal, said each conduction region contact includes metal in a contact liner, said epi capping layer is nitride, said ILD layer is oxide, said doped semiconductor material is phosphorous or arsenic-doped silicon (Si) at NFETs, and boron-doped silicon germanium (SiGe) at PFETs.

3. A method of forming fin field effect transistor (FinFETs), said method comprising:
defining FinFETs on a semiconductor wafer;
epitaxially growing doped semiconductor material (epi) on said fins;
forming a dielectric layer on said semiconductor wafer;
forming a contact pattern through said dielectric layer to said epi, an upper epi surface being exposed in said contact pattern;
opening an extended contact pattern through the exposed said upper epi surface and into said fins; and
forming conduction region contacts in said contact pattern and said extended contact pattern.

4. The method of forming FinFETs as in claim 3, wherein said semiconductor wafer is a silicon on insulator (SOI) wafer and defining FinFETs comprises:
forming fins in a surface layer of said SOI wafer; and
forming metal gates on said fins.

5. The method of forming a FinFETs as in claim 3, wherein growing epi comprises epitaxially growing a first doped semiconductor material on said fins at conduction regions for a first type FinFET and a second type doped semiconductor material on said fins at said conduction regions for a second type FinFET.

6. The method of forming FinFETs as in claim 5, wherein said first doped semiconductor material is phosphorous or arsenic-doped silicon (Si), said first type FETs are NFETs, and said second doped semiconductor material is boron-doped silicon germanium (SiGe) and said second type FETs are PFETs.

7. The method of forming FinFETs as in claim 3, wherein said dielectric layer is an inter-level dielectric (ILD) formed on an epi capping layer.

8. The method of forming FinFETs as in claim 7, wherein said semiconductor material grows epitaxially to form diamond shaped epi encasing fins, said epi capping layer separating adjacent epi diamonds from each other.

9. The method of forming FinFETs as in claim 8, wherein said ILD layer is an oxide layer, said epi capping layer is a nitride layer, and forming said contact pattern comprises masking said ILD layer and etching said contact pattern through said ILD layer and said epi capping layer, the etch being timed to expose said upper epi surface at a diamond vertex above an encased fin.

10. The method of forming FinFETs as in claim 9, wherein opening said extended contact pattern comprises etching said exposed upper epi surface at said diamond vertex with an etchant selective to silicon.

11. The method of forming FinFETs as in claim 3, wherein forming conduction region contacts comprises:
forming a metal liner in said contact pattern and in said extended contact pattern; and
filling said metal liner with metal.

12. A method of forming FinFETs as in claim 11, further comprising connecting wires to said conduction region contacts in a plurality of said FinFETs into a circuit.

13. A method of forming an integrated circuit (IC) including a plurality of fin field effect transistors (FinFETs), said method comprising:
forming replacement metal gate (RMG) FinFETs on a surface layer of a silicon on insulator (SOI) wafer, each RMG FinFET having a metal gate on a channel in a silicon fin with conduction regions in said silicon fin on opposite ends of said channel;
growing semiconductor material epitaxially (epi) on said silicon fins at said conduction regions;
forming an inter-level dielectric (ILD) layer on said SOI wafer, said ILD layer covering said epi;
patterning said ILD layer with a contact pattern with a first etchant through said dielectric layer to an upper epi surface of said epi, a portion of said upper epi surface being exposed in said contact pattern;
extending said contact pattern through the portions into said epi to said silicon fins with a second etchant;
forming contact liners in said contact pattern and through said portions; and
forming contacts in said contact liners.

14. The method of forming an IC as in claim 13, wherein forming RMG FinFETs comprises:
forming fins in a surface layer if a silicon on insulator (SOI) wafer;
forming sacrificial gates on said fins, each sacrificial gate covering a channel between conduction regions on one or more fins;
doping said conduction regions with a selected dopant; and
replacing said sacrificial gates with metal.

15. The method of forming an IC as in claim 13, wherein growing epi forms semiconductor diamond shaped epi encasing fins, a first doped semiconductor material forming diamond shaped epi encasing said fins at conduction regions for a first type FinFET, and a second type doped semiconductor material forming diamond shaped epi encasing said fins at said conduction regions for a second type FinFET.

16. The method of forming an IC as in claim 15, wherein said first doped semiconductor material is phosphorous or arsenic-doped silicon (Si), said first type FETs are NFETs, and said second doped semiconductor material is boron-doped silicon germanium (SiGe) and said second type FETs are PFETs.

17. The method of forming an IC as in claim 16, wherein said dielectric layer is an inter-level dielectric (ILD) formed on an epi capping layer, said epi capping layer separating adjacent epi diamonds from each other.

18. The method of forming an IC as in claim 17, wherein said ILD layer is an oxide layer, said epi capping layer is a nitride layer, and forming said contact pattern comprises:
masking said ILD layer; and etching said contact pattern through said ILD layer and said epi capping layer, the etch being timed to expose said upper epi surface at a diamond vertex above an encased fin.

19. The method of forming an IC as in claim 18, wherein opening said extended contact pattern comprises etching away said diamond vertex, said exposed upper epi surface and into said encased fin with an etchant selective to silicon, internal epi sidewalls being defined above the etched fin.

20. The method of forming an IC as in claim 19, wherein forming conduction region contacts comprises:
- forming a metal liner from the etched surface of said etched fin, along said internal epi sidewalls, and in said contact pattern to the upper surface of said ILD layer; and
- filling said metal liner with metal, said metal contacting said etched surface of said etched fin and said internal epi sidewalls.

* * * * *